United States Patent [19]

Schoenborn

[11] Patent Number: 5,242,536
[45] Date of Patent: Sep. 7, 1993

[54] ANISOTROPIC POLYSILICON ETCHING PROCESS

[75] Inventor: Philippe Schoenborn, San Jose, Calif.

[73] Assignee: LSI Logic Corporation, Milpitas, Calif.

[21] Appl. No.: 632,461

[22] Filed: Dec. 20, 1990

[51] Int. Cl.$^5$ .............................................. H01L 21/00
[52] U.S. Cl. .................................. 156/643; 156/646; 156/657; 156/662
[58] Field of Search ................ 656/657, 662, 643, 646

[56] References Cited

U.S. PATENT DOCUMENTS

| | | | |
|---|---|---|---|
| 4,450,042 | 5/1984 | Purdes | 156/643 |
| 4,490,209 | 12/1984 | Hartman | 156/646 X |
| 4,502,915 | 3/1985 | Carter et al. | 156/646 X |
| 4,521,275 | 6/1985 | Purdes | 156/643 |
| 4,799,991 | 1/1989 | Dockrey | 156/643 |
| 4,867,841 | 9/1989 | Loewenstein et al. | 156/657 X |
| 4,929,301 | 5/1990 | Beechko | 156/657 |
| 4,943,344 | 7/1990 | Tachi et al. | 156/643 |
| 4,948,462 | 8/1990 | Rossen | 156/643 |
| 5,007,982 | 7/1988 | Taou | 156/657 X |
| 5,013,398 | 5/1991 | Long et al. | 156/657 X |
| 5,030,590 | 7/1991 | Amini et al. | 437/233 |

OTHER PUBLICATIONS

*Relation between the RF discharge parameters and plasma etch rates, selectivity and anisotropy*, Zarowin, J. Vac. Sci. Technol., A2(4), Oct.–Dec. 1984, 0734-2101/84/041537-13, 1984, American Vacuum Society.

*Controlled Film Formation during CCl$_4$ Plasma Etching*, Bernacki and Kosicki, J. Electrochem. Soc., Aug., 1984.

*Selectivity and Feature Size Control*, Dry Etching.

Primary Examiner—Thi Dang
Attorney, Agent, or Firm—Gerald E. Linden; Michael D. Rostoker

[57] ABSTRACT

An anisotropic polysilicon etching process in Cl$_2$/HBr/He is disclosed. The use of HBr allows etching to occur under high poly:oxide selectivity conditions (e.g., above 40:1) that would otherwise produce lateral etching of the poly under the photoresist mask (isotropy). The selectivity of poly:resist is also increased (e.g., above 4:1). Poly sidewall passivation is enhanced without relying on resist redeposition. Gate oxide loss is also minimized, and anisotropy is realized with increased overetch (e.g., 60%). Exemplary process settings are: 1) 250 mTorr, 190 Watts, 0.5 cm gap, 100 sccm Cl$_2$, 50 sccm HBr and 40 sccm He; and 2) 270 mTorr, 200 Watts, 0.5 cm gap, 80 sccm Cl$_2$, 55 sccm HBr and 45 sccm He.

19 Claims, 16 Drawing Sheets

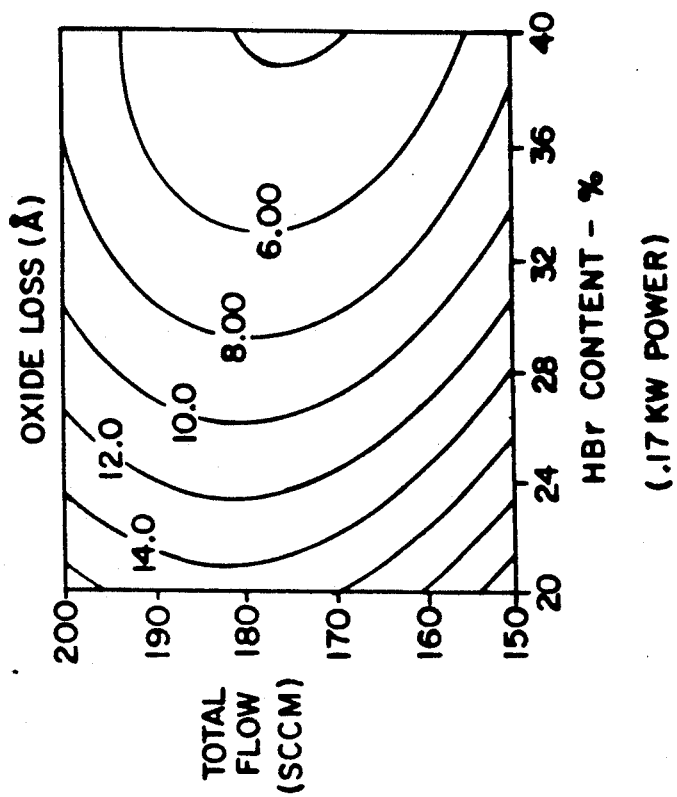

ANISOTROPIC POLYSILICON ETCHING PROCESS

TECHNICAL FIELD OF THE INVENTION

The invention relates to semiconductor device fabrication, and more particularly to plasma etching of polysilicon.

BACKGROUND OF THE INVENTION

Plasma etch processes and apparatus are generally well known for etching materials for semiconductor device fabrication. The process begins with application of a masking material, such as photoresist, to a silicon wafer. The masking pattern protects areas of the wafer from the etch process. The wafer is then placed in a plasma reactor ("etcher") and etched. Subsequent steps are determined by the type of device being fabricated. This process is especially valuable for the definition of small geometries.

A common silicon etch process is based on fluorine. When mixtures such as $CF_4$-$O_2$ are dissociated in an electrical discharge, fluorine atoms are liberated, and volatize the silicon as $SiF_4$. Such processes are isotropic, i.e., they etch in all directions at the same rate. Anisotropic, or vertical etches in silicon are not observed when fluorine is the sole etchant.

For vertical (anisotropic) etches of silicon, the use of gas mixtures such as $C_2F_6$-$Cl_2$ is known. The $C_2F_6$ serves as a source of "recombinants", such as $C_3$. The recombinants suppress (lateral) etching in the horizontal direction (in the plane of the wafer) by recombining with Cl atoms which have been adsorbed on the etched walls. Etching can proceed in the vertical direction (normal to the wafer) because ion bombardment from the plasma suppresses the recombination mechanism.

Submicron polysilicon ("poly") gate patterning requires minimum etch bias and vertical sidewall profiles (anisotropy). In other words, the etching process should not undercut the mask, and the poly line should not be narrower at the poly-oxide interface than it is at the mask-poly interface. FIG. 1A illustrates "acceptable" polysilicon profiles. FIG. 1B illustrates an unacceptable profile that is "re-entrant", or "negative", as would result from the aforementioned undercutting or narrowing. FIG. 1C illustrates an unacceptable profile that is notched, such as would result from a lack of sidewall protection.

Further, the selectivity of etch between poly and the underlying gate oxide (poly:oxide selectivity) must be as high as possible so as to reduce oxide loss. These two requirements, anisotropy and poly:oxide selectivity, can be fulfilled with chlorine-based dry etching processes, as opposed to fluorine-containing plasmas that tend to etch isotropically and have poor selectivity of poly:oxide. Still, even with chlorine-based processes, the selectivity of poly:oxide is compromised for profile control.

Using a typical etcher, such as the top-powered, wafer-grounded LAM 490 etcher, poly:oxide selectivities in excess of 100:1 can be achieved with low power (100 Watt) $Cl_2$/He plasmas, but result in severe undercutting or notching of the poly sidewall (See FIGS. 1B, 1C and 2A). On the other hand, helium-rich (greater than 50%), high power (greater than 200 Watts) processes produce vertical sidewalls at the expense of selectivity (less than 30:1) and tend to incidentally damage the gate oxide. Lateral etching occurs during the overetch cycle and not during bulk poly removal. Hence, the amount of overetch must be limited.

For purposes of the present disclosure, an etch is considered "anisotropic" if no point of the resulting polysilicon profile lies under the mask beyond 0.05 um from the mask edge at the mask-poly interface and after etching is completed, including overetch. This is illustrated in FIG. 1D.

Although etching and sidewall angle formation mechanisms are not well understood or characterized, it is widely recognized that the directionality and energy of ion bombardment from ions accelerated across the plasma sheath, and surface passivation mechanisms from redeposition of materials, play a major role in controlling anisotropy. (See, e.g., "Relation between the RF discharge parameters and plasma etch rates, selectivity and anisotropy", C. B. Zarowin, *J. Vac. Sci. Technol.*, A, Vol.2, No. 4, October-December 1984, and "Controlled Film Formation during $CCl_4$ Plasma Etching", S. E. Bernacki and B. B. Kosicki, *J. Electrochem. Soc.*, Vol 131, No. 8, August, 1984.) For example, when a photoresist mask is used for patterning the poly gates, it can contribute to forming a protective film along the poly sidewall, thereby preventing lateral etching. Vertical profiles can also be obtained with oxide masks, in which case sidewall protection may result from redeposition of etched silicon-containing material, or from the gas-phase chemistry itself. In addition, the shape of the poly sidewall will depend on the poly doping level and the doping method (e.g., $POCl_3$, implant). Heavily doped poly is more likely to etch isotropically. Non-annealed, implanted poly tends to form a notch half way along the profile (See e.g., FIG. 1C), possibly at the location of peak dopant concentration, and it terminates by a "foot" at the oxide interface where dopant concentration is minimum.

The use of Bromine (Br) containing plasmas is becoming increasingly popular for high selectivity anisotropic poly etch. Compared to chlorine, it is found to further increase the poly:oxide selectivity, and especially the poly:resist selectivity, while maintaining anisotropy with long overetch percentages (e.g., 100%). High selectivity still works against profile control, but the threshold of compromise is pushed far enough that one has to worry about other factors, such as removal of the passivation layer.

Most, if not all, plasma etcher manufacturers now offer poly etch processes using bromine. Magnetically enhanced (magnetron) etchers from Materials Research Corp., such as the MRC Aries (Trademark), and Applied Materials, such as the AMAT Precision 5000 (Trademark), use $Cl_2$/HBr, while those from Tegal Corp., such as the MCR (Trademark), use pure $Br_2$. Etchers from Lam Research Corp., such as the Rainbow 4400 (Trademark), offer a process using $Cl_2$/HBr/He. These etchers have high selectivity and good profile control. Unfortunately, because bromine enhances sidewall passivation, it also forms a sidewall film that cannot always be stripped either in sulfur peroxide or by ashing, but requires an HF dip. An HF dip is not desirable, mostly because it etches some of the gate oxide, but also because it adds a step to the process. In such a case, the advantage of high poly:oxide selectivity offered by using Br is partly lost.

With previous methods of polysilicon ("poly") etching, using Chlorine ($Cl_2$), there has been an inherent compromise between anisotropy and selectivity to oxide. High selectivity processes tend to be isotropic.

Information Disclosure Statement

U.S. Pat. No. 4,943,344 discloses an etching method using $Br_2$ and forming a deep trench etch in single crystal silicon with photoresist mask at temperatures below $-100°$ C.

In contrast thereto, the present invention relates to an anisotropic polysilicon etch for gate definition using a parallel plate etcher with water cooled electrodes at $0°-90°$ C., preferably at approximately $20°$ C. Actual plasma neutral and ions temperature is on the order of $300°$ K. (degrees Kelvin), as opposed to the electron temperature which is on the order of $10,000°$ K., and is not controlled per se.

U.S. Pat. No. 4,799,991 discloses a process for preferentially etching polysilicon selectively to monocrystalline silicon using HBr additions to noncarbonated etchants and small additions of oxygen.

In contrast thereto, the present invention relates to etching polysilicon selectively to oxide using HBr addition to noncarbonated etchants. Specifically, wafers are made of monocrystalline silicon with one crystalline orientation facing the surface, as opposed to polycrystalline silicon (polysilicon) made of clusters of crystalline silicon arranged in no particular order. The monocrystalline substrate should not be exposed, and oxygen additions should be prevented by reducing air leaks. Leak back rate is less than 5 mTorr/min, which corresponds to less than 0.4 percent $O_2$ by volume.

U.S. Pat. No. 4,502,915 discloses a two-step plasma process for selective anisotropic etching of polycrystalline silicon without leaving residue. In a first step, a poly etch nonselective to oxide or residues is performed with a fluorine-containing species, and about 1500 Å of poly is removed. In a subsequent step, a selective etching is performed.

In contrast thereto, in the present invention, HBr is suppressed in a "breakthrough" step, for native oxide breakthrough. Fluorine containing species (e.g., $SF_6$) are specifically avoided, and breakthrough step time is limited (e.g., to approximately 5 sec. so as to preserve anisotropy. Typically, about 300Å of poly is removed during this step.

U.S. Pat. No. 4,490,209 discloses plasma etching using Hydrogen Bromide addition, wherein the bromine-chlorine mole ratio is in the range of from about 1% to about 10%. In column 2, lines 62-64 thereof, it is suggested that HBr can prevent lateral etching and increase the selectivity to $SiO_2$.

In the present invention, the bromine-chlorine mole ratio is maintained above 25% (e.g., at approximately 34%) in order to achieve anisotropy and poly:oxide selectivity with reliability.

U.S. Pat. Nos. 4,450,042 and 4,521,275 (continuation of 4,450,042) disclose plasma etch chemistry for anisotropic etching of silicon specifically employing Bromine gas ($Br_2$) and an inert gas concentration at least three times that of the bromine compound.

In U.S. Pat. Nos. 4,490,209, 4,450,042 and 4,521,275 it is suggested that chemistries based on chlorine have been considered necessary for vertical (anisotropic) etching of silicon, and discharges of pure $Cl_2$ have been found useful for this purpose. However, some silicon materials, such as highly doped polysilicon, may still experience some undercutting if etch conditions are not closely controlled.

In the present invention, HBr is employed, which is easier to handle than $Br_2$. The inert gas (He) concentration is less than that of the HBr so that the plasma remains stable and etching is effective.

Additionally, in the present invention, the purpose of adding HBr to a $Cl_2$/He plasma is to be able to raise the selectivity of poly:oxide and/or the % overetch, without losing anisotropy.

The patents described above do not resolve the poly:oxide selectivity issue, and do not recognize the trade-off between selectivity and anisotropy. Neither do they recognize that etching tends to become more isotropic during overetch, when the underlying oxide is exposed. (Overetching is necessary in order to ensure that no residues are left on the wafer. If etching was stopped at the "endpoint", as determined by optical emission from the plasma, only parts of the wafer would be completely etched while other parts would still be covered with remaining polysilicon. This is due to the fact that both the initial polysilicon film thickness and the etch rate are not perfectly uniform.)

DISCLOSURE OF THE INVENTION

It is therefore an object of the invention to provide a polysilicon etching process with improved sidewall profiling.

It is a further object of the invention to provide a polysilicon etching process with improved poly:oxide selectivity, i.e., on the order of greater than 30:1.

It is a further object of the invention to provide a polysilicon etching process with improved poly:resist selectivity, i.e. on the order of greater than 4:1.

It is a further object of the invention to provide a polysilicon etching process with improved sidewall passivation.

It is a further object of the invention to provide a polysilicon etching process that operates at "reduced" (as opposed to "baseline" processes not employing HBr) plasma pressures.

It is a further object of the invention to provide a polysilicon etching process that minimizes the tradeoff between poly:oxide selectivity and anisotropy.

It is a further object of the invention to provide a polysilicon etching process that is amenable to a high degree (i.e., $>60\%$) of overetch, without sacrificing anisotropy.

It is a further object of the invention to provide a polysilicon etching process that meets the performance targets outlined above over a wide window of the etcher parameter space so that the process is relatively insensitive to small variations of the process parameters.

It is a further object of the invention to provide a polysilicon etching process that is useful for submicron technologies.

It is a further object of the invention to provide a polysilicon etching process having high etch rate uniformity, e.g. on the order of within $+/-5\%$ It is a further object of the invention to provide a polysilicon etching process capable of a high throughput.

According to the invention, polysilicon etching is performed in a gas containing Helium (He), Hydrogen Bromide (HBr) and a chlorine-containing gas such as $Cl_2$, $BCl_3$ or HCl. In the main hereinafter, the chlorine-containing gas $Cl_2$ is discussed.

The percent of He flow in the total flow (of He/HBr/$Cl_2$) is established at 0-30% of the total flow. The percent of HBr in the balance of the total flow (excluding the He) is established at 30-50%. The remaining flow is $Cl_2$.

Gas pressure is established in the range of 230-270 mTorr, and the total flow rate is established in the range of 150-200 sccm. Discharge power is established in the range of 150-200 Watts, and the discharge gap is established in the range of 0.5-0.6 cm. Various specific "recipes" within these ranges are set forth herein.

Further according to the invention, during overetch, the discharge power is reduced by up to 50%.

Further according to the invention, in an initial breakthrough step, preceding the "main" etch step, the HBr (bromine addition) is not present. (Breakthrough is performed with He/Cl$_2$ only.)

A wafer etched according to the disclosed process, and the gas for etching are also disclosed.

FIG. 3 shows generally the improvements that can be achieved using the disclosed process (i.e., using HBr). In a chlorine-only process, shown at 302, poly:oxide selectivity on the order of 30:1 and poly:resist selectivity on the order of 1.6:1 can be achieved. Vertical profiling can be achieved with less than 50% overetch, but there is occasional notching. In a chlorine/helium process, shown at 304, low pressures and powers can be employed and high selectivities can be achieved. However, the process tends to be isotropic. As shown at 306, hydrogen-bromide is beneficially employed to augment either of these two processes, resulting in high selectivities and vertical profiles with long overetch possible, as shown at 308.

The disclosed process produces vertical sidewalls while achieving higher selectivity to oxide than a Cl$_2$/He plasma. Further, by using HBr in the etching process, poly:oxide selectivity is enhanced without losing anisotropy and without relying on resist passivation. Further, by using HBr in the etching process, He content can be reduced, selectivity can be improved, and better profile control can be achieved.

The disclosed process has utility in submicron, Poly-1 etch technology (gate polysilicon), e.g. for etching at 0.7 um.

Other objects, features and advantages of the invention will become apparent in light of the following description thereof.

The following terms and abbreviations are (or may be) used herein: polysilicon (poly); Chlorine (Cl$_2$); Helium (He); Hydrogen-Bromide (HBr); milliTorr (mT, or mTorr); standard cubic centimeters per minute (sccm); centimeters (cm); Angstroms (Å); microns ($\mu$m); nanometers (nm); degrees Celsius (°C.); degrees Kelvin (°K.); watts (W); kilowatts (KW); etch rate (ER); critical dimension (CD); scanning electron microscope (SEM); seconds (sec); minutes (min); hours (hr); less than (<); greater than (>); percent (%); ratio of one element "X" to another element "Y" (X:Y).

BRIEF DESCRIPTION OF THE DRAWINGS

FIGS. 11A and 11B are contour plots of calculated oxide loss in the first test matrix.

DETAILED DESCRIPTION OF THE INVENTION

Figures 1A, 1B, 1C:
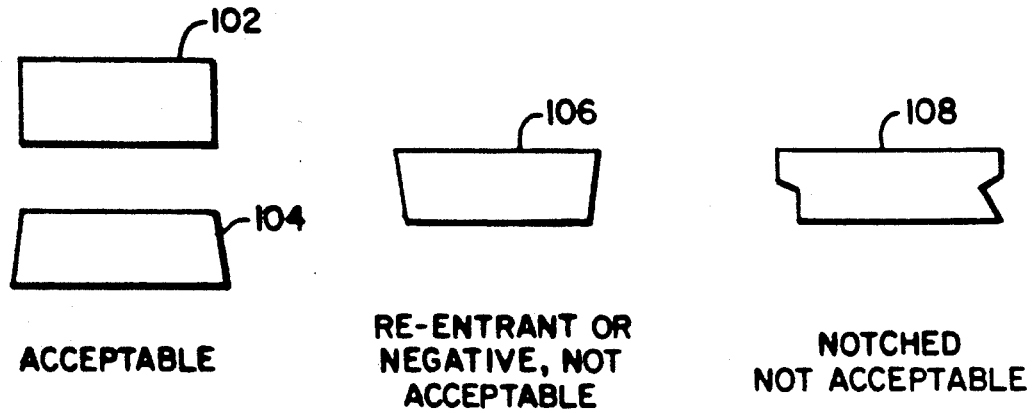
FIG. 1A is a schematic representation of a cross-section of a polysilicon gates, exhibiting acceptable sidewall profile, such as may be produced with various prior art etching techniques, or with the etching technique of the present invention.
FIG. 1B is a schematic representation of a cross-section of a polysilicon gate, exhibiting an unacceptable re-entrant or negative sidewall profile.
FIG. 1C is a schematic representation of a cross-section of a polysilicon gate, exhibiting an unacceptable notched sidewall profile.
Figure 1D:
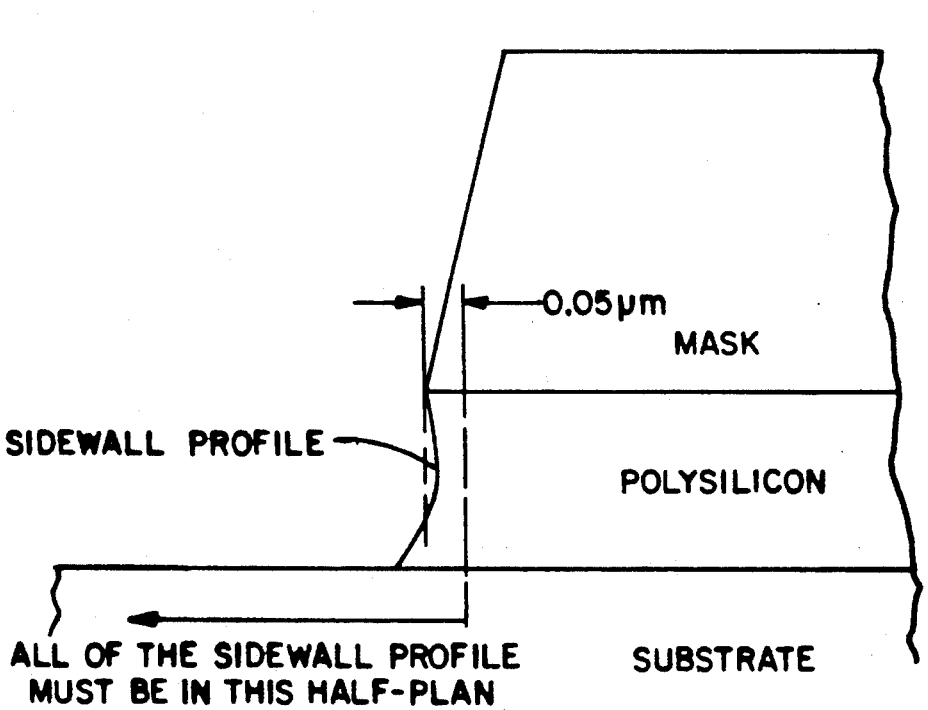
FIG. 1D is a schematic representation of profile specifications for anisotrophy.
Figure 2A:
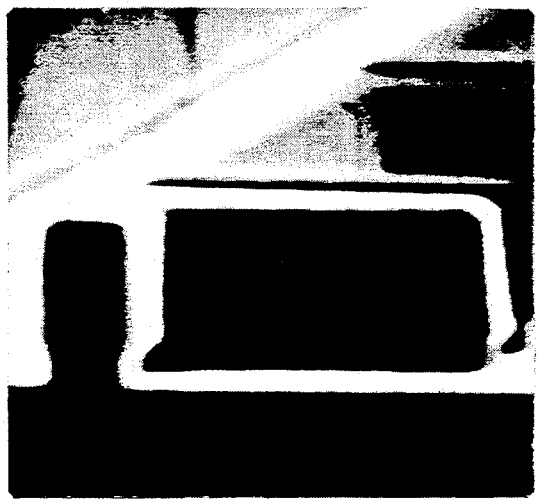
FIG. 2A is a photomicrograph showing a notched sidewall. (Compare FIG. 1C)
Figure 2B:
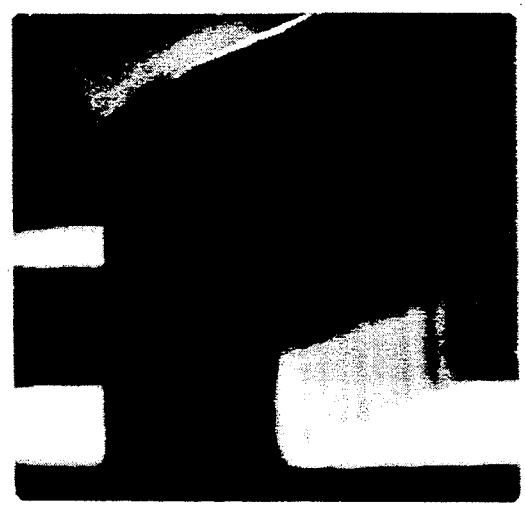
FIG. 2B is a photomicrograph showing a vertical sidewall. (Compare FIG. 1A at 102)
Figure 4:
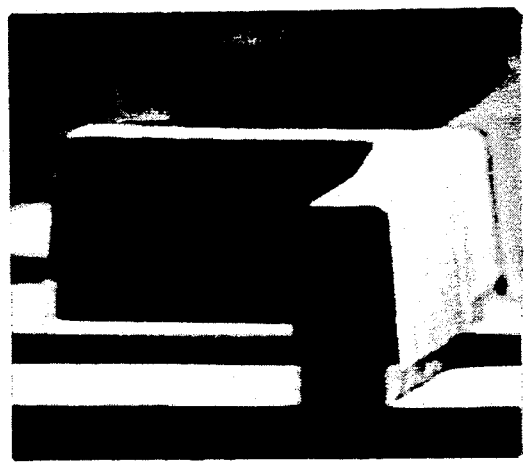
FIG. 4 is a photomicrograph of an isotropic etch in 15% HBr in a total flow of HBr and Cl$_2$.
Figure 5:
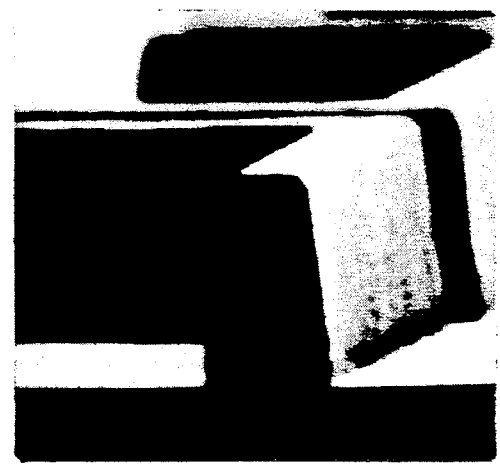
FIG. 5 is a photomicrograph of an anisotropic etch in 30% HBr in a total flow of HBr and Cl$_2$.
Figure 3:
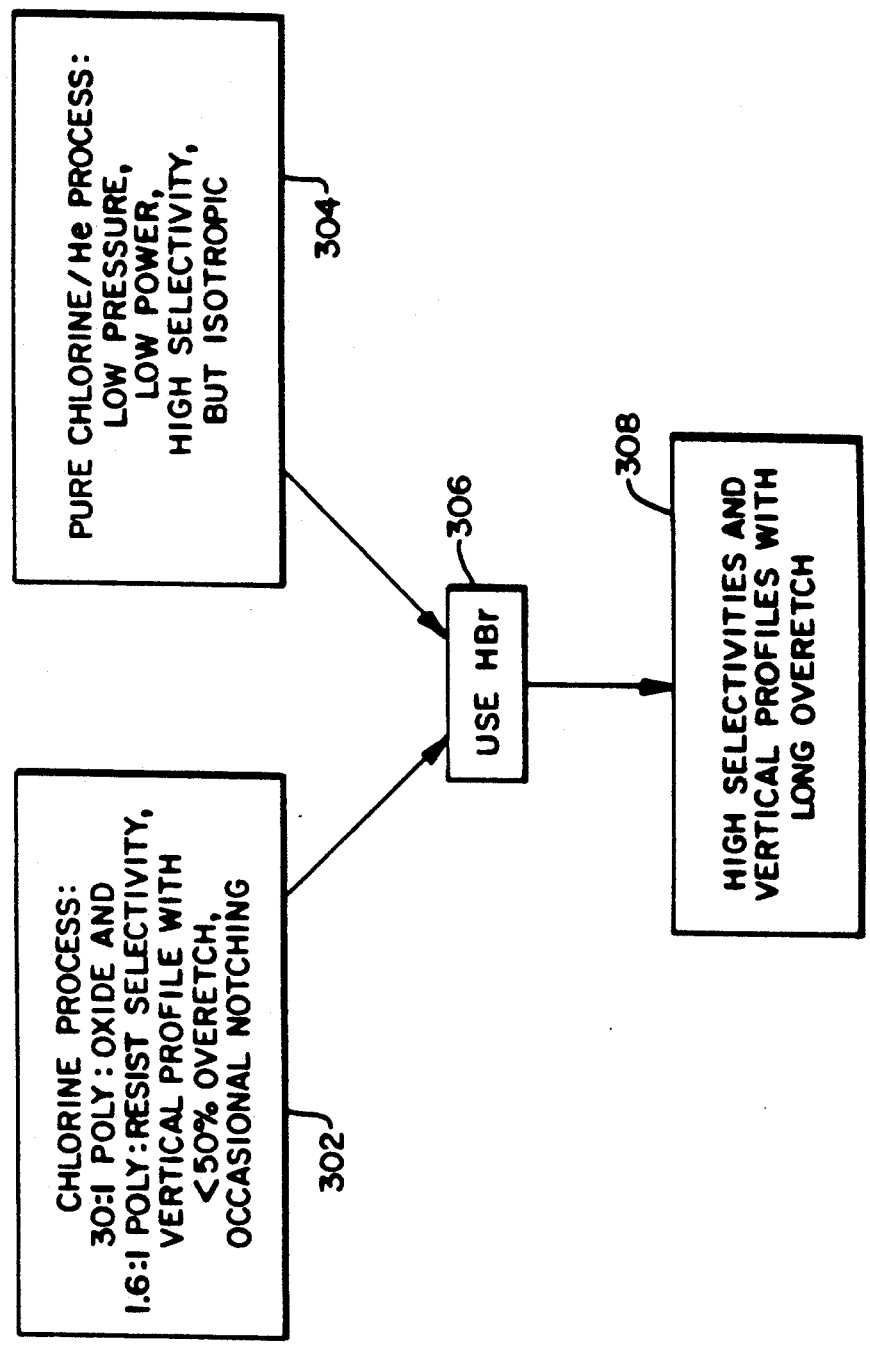
FIG. 3 is a generalized graphic representation of the process and advantages of the present invention.

According to the present invention, a dry etching process is disclosed for anisotropic polysilicon etching using HBr gas along with Cl$_2$ and He. The process improves profile control, improves poly:oxide and poly:resist selectivities, and indicates improvements in sub-micron technology.

In the discussion that follows, results are based on investigations performed on the LAM 490 (Trademark) Etcher, available from LAM Research Corp. of Fremont, CA, but the invention is not limited to the use of this particular etcher. The LAM 490 etcher is a parallel plate etcher having 8 inch parallel anodized aluminum electrodes with a variable gap from 0.25 cm to 2.5 cm. Gases are fed through a shower-head type top electrode. The top electrode (cathode) is powered by a 1250 Watt solid state generator. The bottom electrode (anode) is grounded. Gas flows are adjustable from 0-200 sccm. Operating pressure is adjustable from about 100 mTorr to 10 Torr. The etcher has automatic wafer transport with load-lock.

Investigative Methodology

Table I, presented below, illustrates etching performance of a "baseline" process using only $Cl_2$ and He, the "target" for the process of this invention (using HBr and different etcher parameter settings), and the "reasons" for selecting the target parameters.

Aside from selectivity (poly:resist and poly:oxide) and profile control, the process must also satisfy other requirements specific to the equipment used. Overall, the goal is not only to achieve high performances under optimum conditions, but to develop a process that meets these performance targets over a wide window of the parameter space so that it is insensitive to small variations of the process parameters (pressure, power, etc.). For instance, electrode spacing should be made as large as possible to reduce the effects of small gap variations. Another example is to operate at lower pressure. Low pressure processes rely less on sidewall passivation, and because collisions in the sheath are less likely, they enhance ion directionality.

TABLE I

Baseline etch process and target parameters:

| Parameter | Baseline | Target | Reason |
|---|---|---|---|
| power (Watts) | 175 | low, 100? | minimize damage increase selectivity |
| pressure (mT) | 350 | low, 100? | profile control |
| gap (cm) | 0.46 | high, 1.0? | widen window |
| $Cl_2$ (sccm) | 65 | ? | |
| He (sccm) | 150 | low | confine plasma |
|  |  | high | reduce loading, improve mix, enhance cooling |
| HBr | none | low | but enough to enhance profile control & selectivity, not too much to avoid resist stripping problems |
| poly etch rate (Å/min) | 4000 | >3000 | throughput |
| uniformity* | <±5% | <±5% | |
| selectivity poly:oxide | 30:1 | >90:1 | reduce oxide loss |
| oxide loss (Å) | <50 | <20 | preserve implant mask |
| selectivity poly:resist | 1.6:1 | high | reduce CD loss |
| CD loss | NA (<0.1 μm ?) | not measurable | litho limited |
| CD uniformity | 1σ < 0.02 μm | litho limited | |
| profile | occasionally negative with $POCl_3$ poly, foot with implanted poly | always vertical, insensitive to doping level & method, % overetch | device performance |

Uniformity ("U") is determined by taking a plurality of measurements per wafer, and equals 100(max-min)/(max+min)

Table II, presented below, illustrates the experimental "grid" for studying the parameter space of the LAM 490 etcher. Individual operating parameters are varied within the total operating window for the etcher. (Results are characterized using Response Surface Methodology (RSM), a mathematical method for characterization and optimization of processes based on Statistical Design of Experiments (SDE) and least-square fits.)

TABLE II

| Parameter | Range |
|---|---|
| pressure (mT) | 100 to 350 |
| power (Watts) | 100 to 300 |
| gap (cm) | 0.46 to 1.00 |
| total flow | 60 to 570 |
| % helium | 0 to 70 |
| % HBr* | 10 to 100 |
| Total | |

The percent HBr (%HBr) is taken as a percentage of the combined flow of $Cl_2$ and HBr (exclusive of the He flow).

Two methodologies were investigated: 1) simply add HBR or replace $Cl_2$ by HBr in the "baseline" process; or 2) start from "desirable" conditions as listed under "target" in Table I. Here, "desirable" conditions refer to a set of pressure, power values, etc. that is preferred from a process maintenance viewpoint, and based on the latest trends in plasma etching. A difficulty in the first approach (simply add HBr or replace $Cl_2$ by HBr in the "baseline" process) is that the test apparatus had already been optimized for etch rate, uniformity, selectivity and profile, with chlorine and helium only. By simply adding HBr (or replacing $Cl_2$), this delicate balance would get upset. For example: 1) by adding 10 sccm of HBR to the baseline process, the poly:oxide selectivity was not significantly improved, and results were not very consistent; 2) by reducing the $Cl_2$ flow by 10 sccm and replacing it with 10 sccm of HBr, a non-etching plasma resulted (it would seem that HBr tends not to maintain the discharge as efficiently as $Cl_2$); 3) by adding 20 sccm HBr to a high poly:oxide selectivity process (175 Watts, 350 mTorr, 0.46 cm gap, 161 sccm $Cl_2$, 54 sccm He, 60:1 poly:oxide, less than 2:1 poly:resist), the poly:resist selectivity improved (to 7:1), but the poly:oxide selectivity was not improved; 4) at low pressure (less than 150 mTorr) and low power (less than 150 Watts), only Helium-free discharges could be sustained, and by adding HBr the plasma was often unstable; 5) at 250 mTorr, 100 Watts, 0.46 cm gap, 115 sccm $Cl_2$, 20 sccm HBr and 20 sccm He, etching was isotropic.

However, at 250 mTorr, 190 Watts, 0.5 cm gap, 100 sccm Cl₂, 50 sccm HBr and 40 sccm He, etching became anisotropic. This region was selected for further investigation because it is comfortably within the operating window, but still 100 mTorr below the baseline process pressure.

In the experimental results that follow, it will be noted that higher power is required to exploit the advantages of HBr (which is not surprising since the H-Br bond is stronger than the Cl—Cl bond), and that the HBr flow should be at least 50% of the Cl₂ flow to play a significant role. Further, it will become apparent that more than increasing poly:oxide selectivity, the major benefit of HBr would seem to be in enhancing sidewall passivation.

Process Optimization

The process was "fine tuned" to obtain a poly etch rate uniformity ("U") within +/−5%. This was achieved in two steps, using two matrices whose data are summarized below.

First Test Matrix

A first matrix was run with the following process parameters: power (150-190 Watts), %HBr in total flow (20-40%), and total flow (150-200 sccm), a fixed 50% Cl₂ in total flow (10-30%) balance flow of He, 250 mTorr pressure, and gap set at 0.5 cm. A Box-Behnken design with 15 wafers, including 3 center points, was used.

FIGS. 6-11 show contour plots of poly etch rate, oxide etch rate, uniformity of poly etch rate and its inverse, selectivity poly:oxide and poly:resist, theoretical CD and oxide losses.

Etch rate and uniformity were calculated from 5 points measurements per wafer (top, center, bottom, left, right). The etch rate (ER) is the average of 5 values: ER =(before-after)/(etch time), where "before" and "after" are the before etch and after etch poly thicknesses, respectively. The uniformity (U) was computed as: U =100 × (max-min)/(max+min), where "max" and "min" are the maximum and minimum ER values, respectively.

Figure 6B:
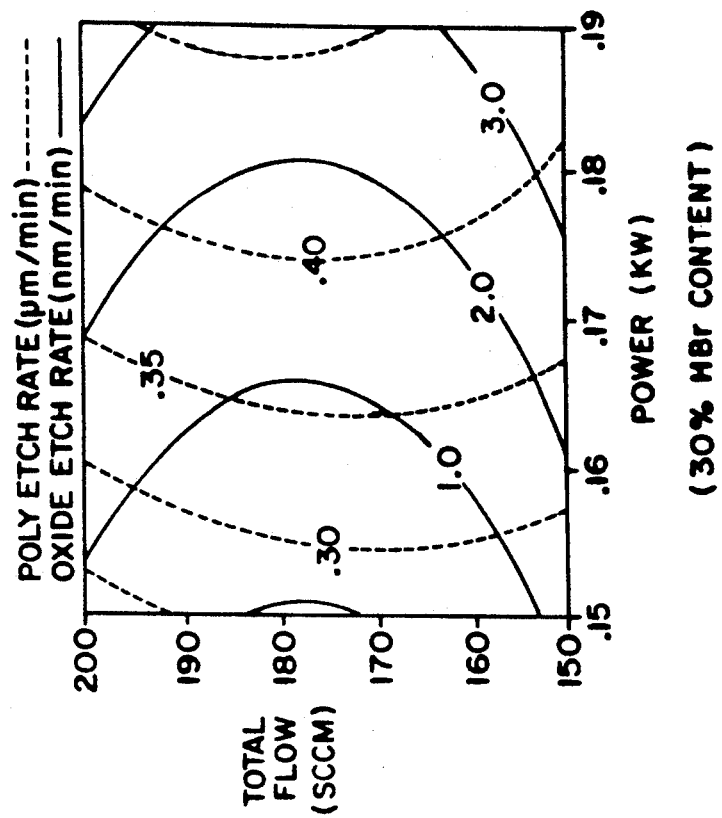
FIGS. 6A and 6B are contour plots of poly and oxide etch rates in a first test matrix.
Figure 6A:
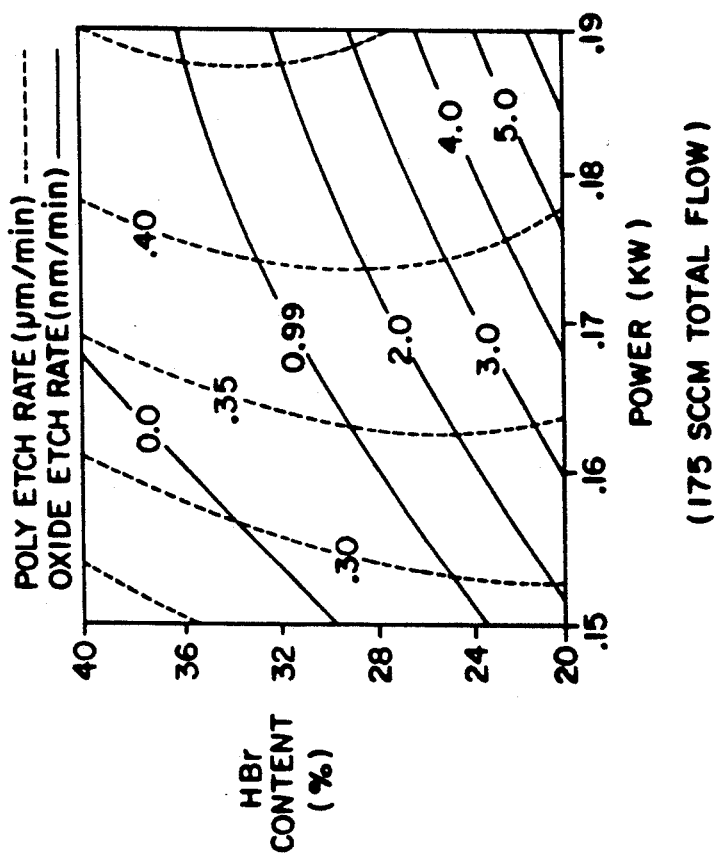

In FIGS. 6A and 6B, poly (dotted lines) and oxide (solid lines) are shown. Poly:oxide selectivity trends in excess of 100:1 are observed.

Figure 7B:
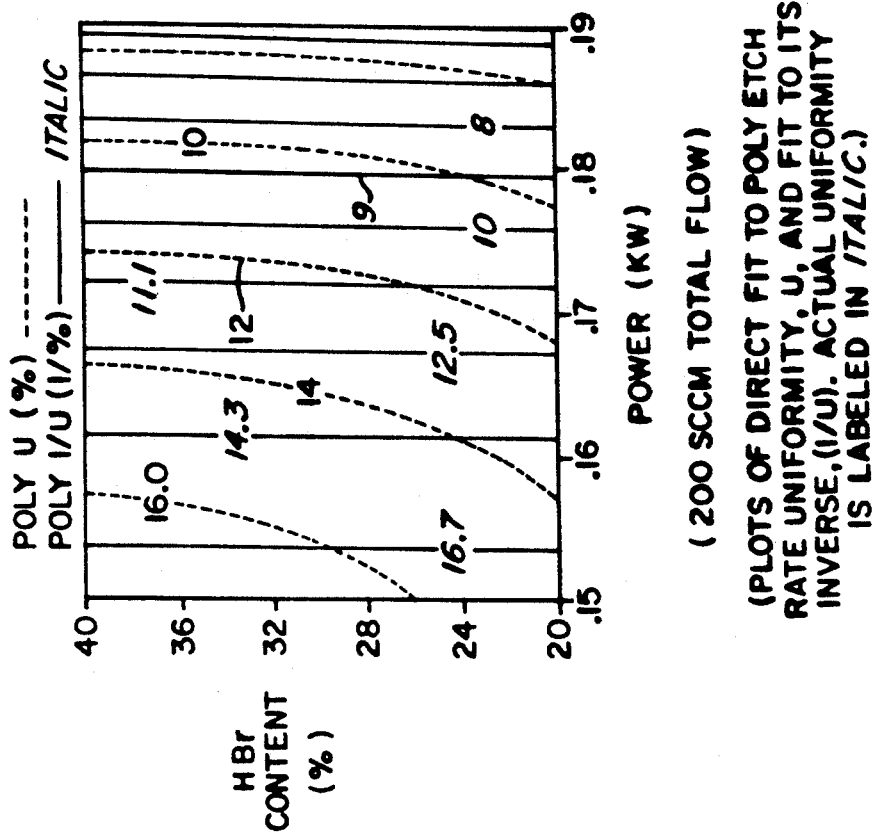
FIGS. 7A and 7B are contour plots of direct fit to poly etch rate uniformity and fit to its inverse, in the first test matrix.
Figure 7A:
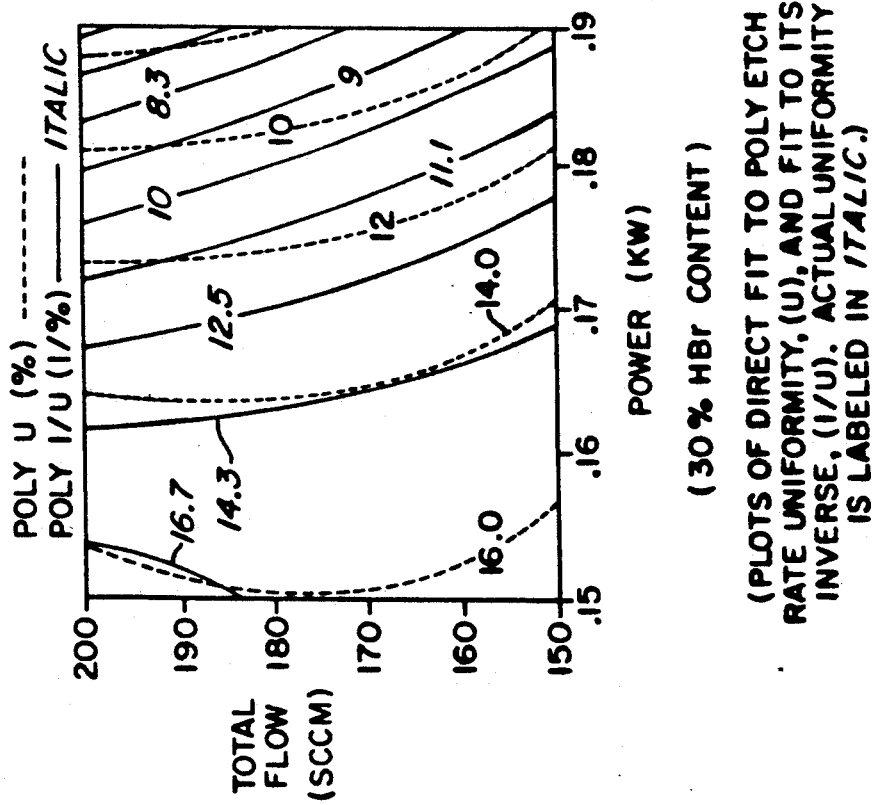

FIGS. 7A and 7B are contour plots of direct fit to poly etch rate uniformity (dotted lines) and fit to its inverse (solid lines). Actual uniformity is labeled in italic. As is evident, uniformity ("U") is unacceptably large, e.g., >5%.

Figure 8B:
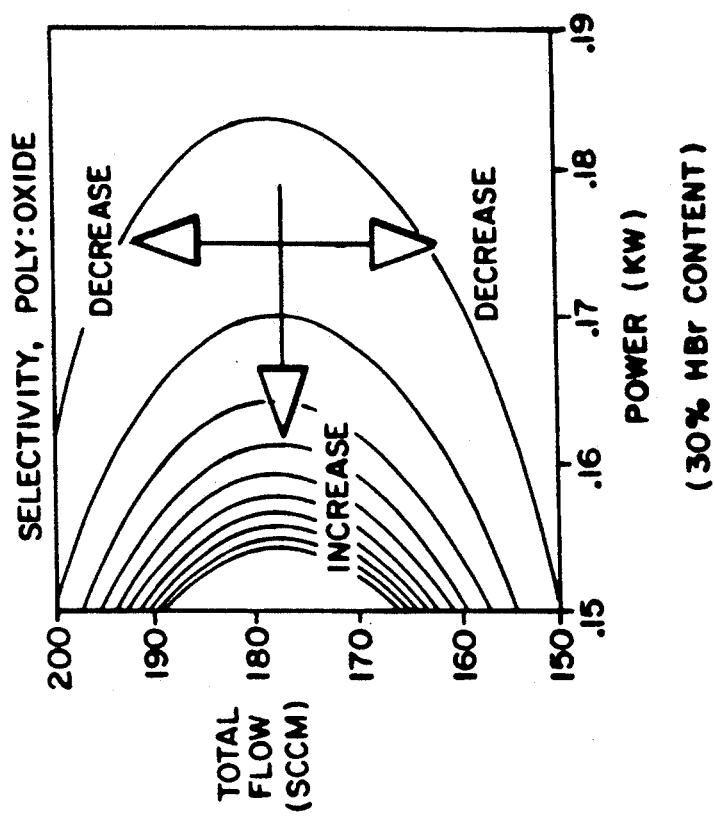
FIGS. 8A and 8B are plots of general trends of selectivity poly:oxide in the first test matrix.
Figure 8A:
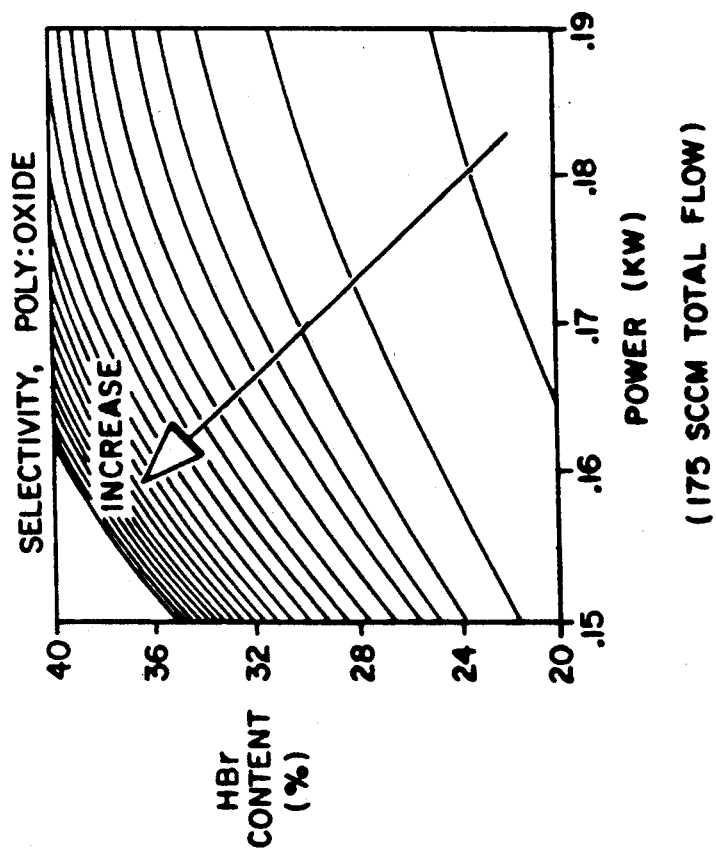

FIGS. 8A and 8B are plots showing general trends of poly:oxide selectivity. The selectivity poly:oxide was not fitted per se because it increases dramatically at low powers or at high HBr content, which makes it impossible to get a good fit using quadratic surfaces. Rather, the ratio itself of poly and oxide etch rates was plotted. Trends only are shown because actual selectivities may vary greatly at such high values. The actual selectivities can be calculated from the results illustrated in FIGS. 6A and 6B. On the other hand, as shown in FIGS. 9A and 9B, the selectivity of poly:resist fitted quite well to a quadratic surface.

Figure 9B:
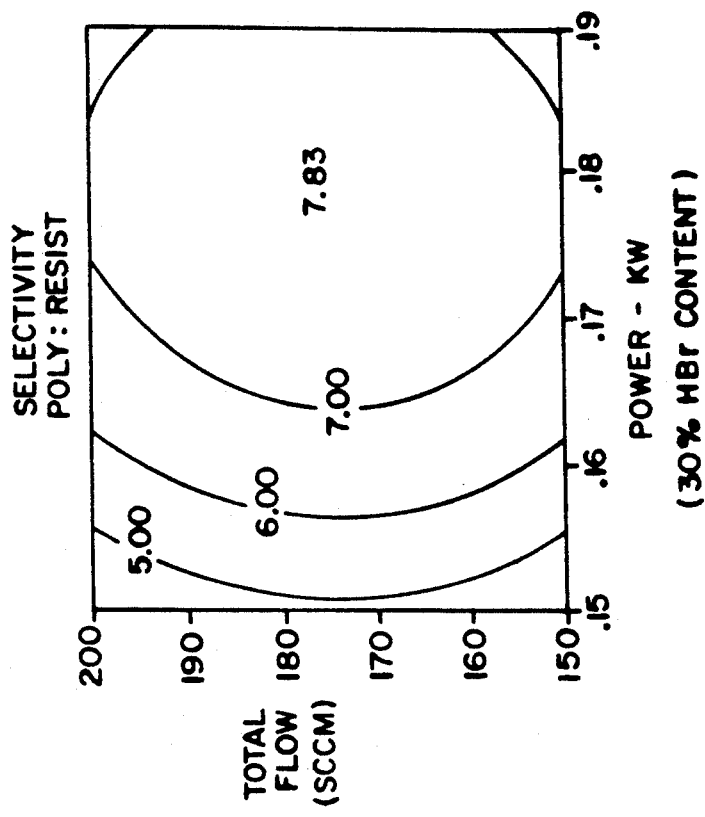
FIGS. 9A and 9B are contour plots of selectivity poly:resist in the first test matrix.
Figure 9A:
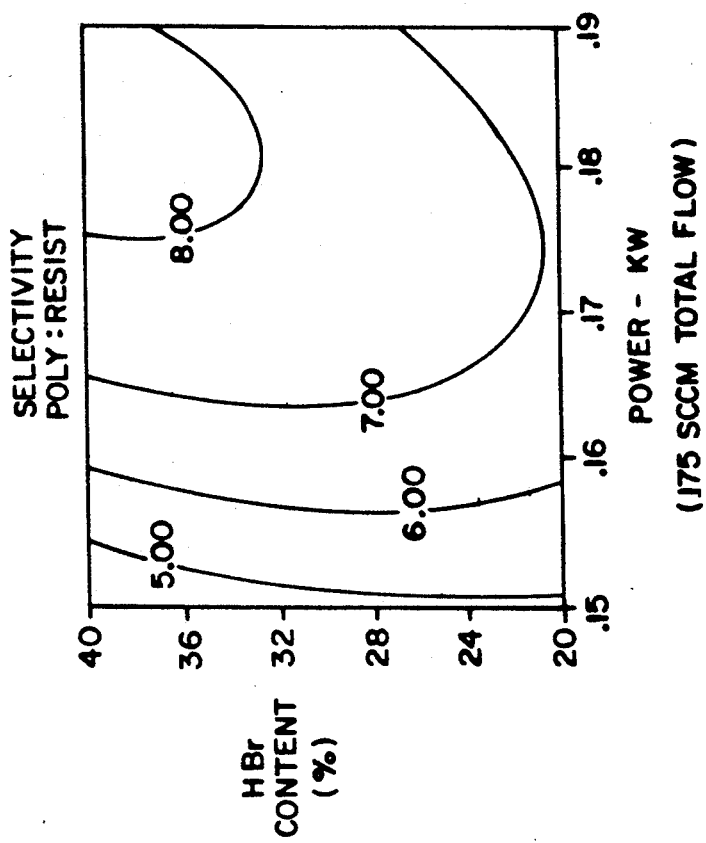

FIGS. 9A and 9B are contour plots of poly:resist selectivity.

Figure 10B:
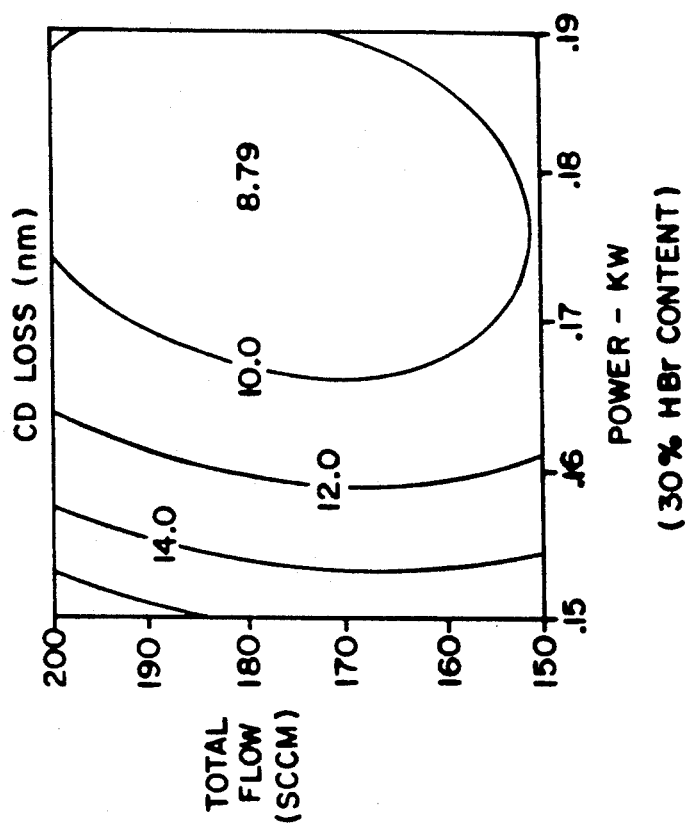
FIGS. 10A and 10B are contour plots of calculated CD loss, in the first test matrix.
Figure 10A:
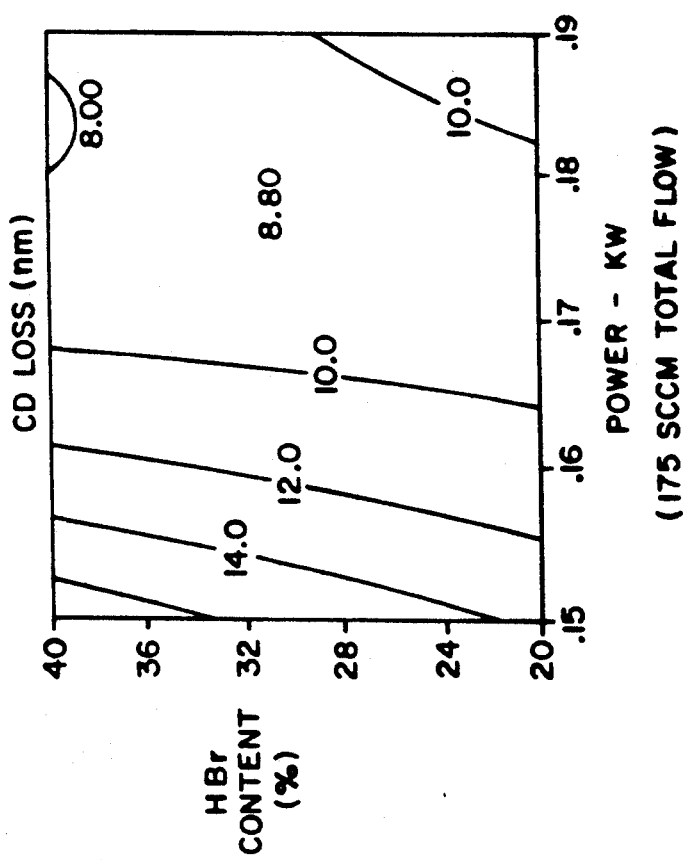

FIGS. 10A and 10B are contour plots of calculated Critical dimension (CD) loss. The worst case CD loss fitted and plotted in FIG. 10 is calculated from the following formula:

$$\Delta CD = 2\frac{Vh(1 + d)(1 + D)}{E(1 - p)}[\cos t + L/V]$$

wherein:

V is the mask vertical etch rate (measured);
L is the mask lateral etch rate (L=0, assumed);
h is the poly thickness (3300 Å);
E is the poly etch rate (measured);
t is the mask sidewall angle from horizontal (85, assumed);
d is the poly thickness uniformity (0.01-1%, assumed);
D is the fraction of overetch time (0.3=30%); and
p is the poly etch rate uniformity (measured).

The actual CD loss (ΔCD) may well e a lot less than predicted by the above equation because of sidewall passivation, whereas in this formula the CD loss is directly related to lateral recess of the resist sidewall depending on its angle. Even with an assumed value of L=0 (no lateral etching of the mask), ΔCD is not equal to zero when t<90°. Although theoretical, this formula reflects the strain placed on the mask, not only by the selectivity poly:resist alone, but also by other factors such as uniformities and overetch, as can be seen by comparing FIGS. 9 and 10. The same remarks apply to the calculated oxide loss plotted in FIG. 11.

FIGS. 11A and 11B show contour plots of calculated oxide loss (D). In this case, the actual gate oxide loss is known to be greater than represented in FIG. 11, but it shows trends of how the selectivity poly:oxide is weighted against other factors in determining the loss. Here, the oxide loss is calculated as follows:

$$D = 2\frac{d(1 + Uo)(Un + Ue)}{S(1 - Ue)^2}$$

where:

d is the poly thickness (3300 Å);
s is the selectivity poly:oxide (measured);
Uo is the oxide etch rate uniformity (measured);
Un is the poly thickness uniformity (0.01=1%, assumed); and
Ue is the poly etch rate uniformity (measured).

This formula gives the oxide loss at the point where all the poly has been removed, but does not account for additional "safety" overetch performed on products. More will be said regarding gate oxide loss, hereinafter. FIG. 11 can be compared with FIG. 8. It can be seen that CD and oxide losses are not directly proportional to either the selectivity poly:resist or poly:oxide, as might be expected.

As expected, both the poly and resist etch rates increase with power. However, the resist etch rate increase is relatively slower than the poly etch rate increase, and therefore the selectivity poly:resist increases with power within the observed power range. This is unusual, but may be a manifestation of the fact that the H-Br bond is stronger than the Cl—Cl bond. Since for a given dissociation rate more power is required to break HBr than Cl₂, more power would also be required to make efficient use of HBr as an inhibitor of resist etching.

The selectivity poly:oxide behaves more typically as it increases with decreasing power. Also expected is the increase of selectivity of poly:oxide with increasing HBr content.

Of greater importance, the uniformity of poly etch rate improves (diminishes) with increasing power, but is independent of HBr content and total flow.

In general, the total flow setting does not have a major impact on the measured responses, and it seems to be optimum at about 180 sccm where maximum poly etch rate and selectivity poly:oxide are observed. Note that if the gas residence time in the plasma is related to the inter-electrode volume (i.e., gap) and to the pressure, then the 180 sccm flow at 0.5 cm gap and 250 mTorr (matrix settings) corresponds, at 0.46 cm gap and 350 mTorr ($Cl_2$ baseline process setting) to a total flow of 232 sccm, which is close to the 215 sccm baseline flow.

Second Test Matrix

In this test matrix, the following process parameters were used: 0.5–0.6 cm, pressure 230–270 mTorr %$Cl_2$ in total flow 30–50%, power 190 Watts, total flow 200 sccm, HBr flow 55 sccm (27.5%).

Figure 12B:
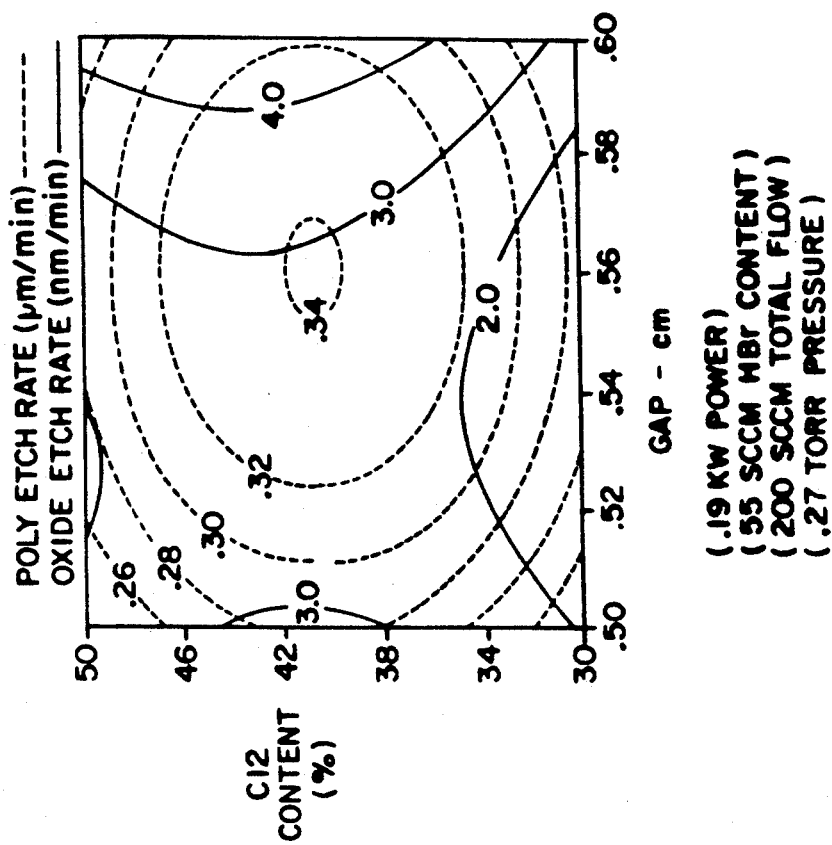
FIGS. 12A and 12B are contour plots of poly and oxide etch rates, in a second test matrix.
Figure 12A:
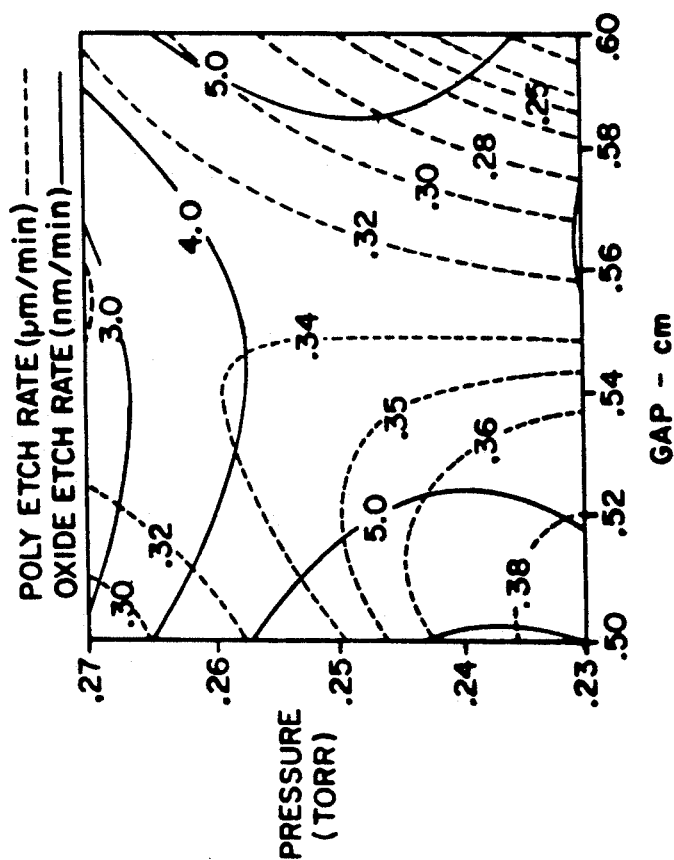

FIGS. 12A and 12B are contour plots of poly (dotted lines) and oxide (solid lines) etch rates at 190 Watts, 55 sccm HBr, 200 sccm total flow. Herein, the inverse of the poly etch rate was fitted instead of the uniformity itself, since it was found to be better represented by a second order polynomial. The target for uniformity being <5%, its inverse target is >0.2. Uniformity, poly and oxide etch rates and selectivity poly:resist are mapped out in FIGS. 12, 13 and 14.

Figure 13B:
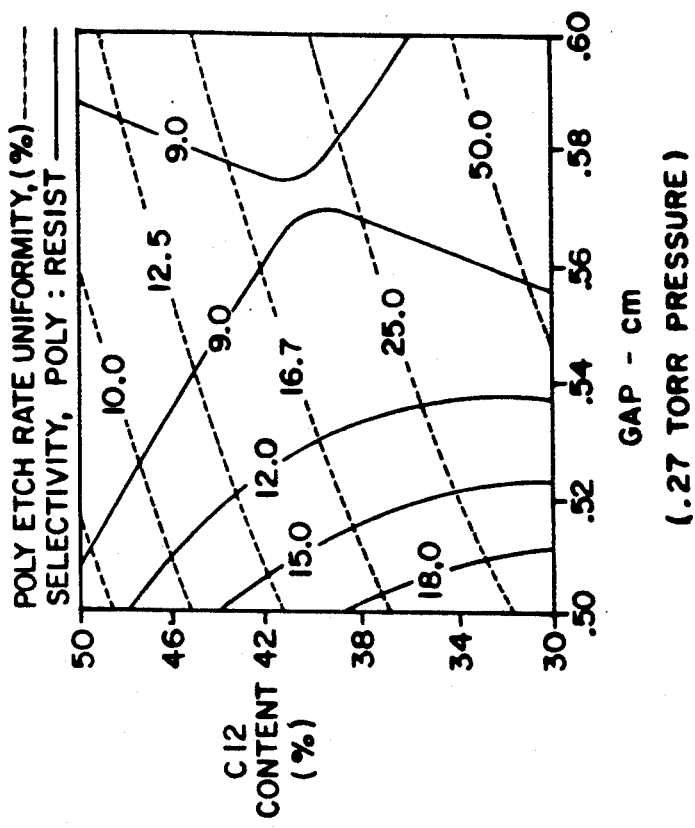
FIGS. 13A and 13B are contour plots of poly etch rate uniformity and selectivity poly:resist in the second test matrix.
Figure 13A:
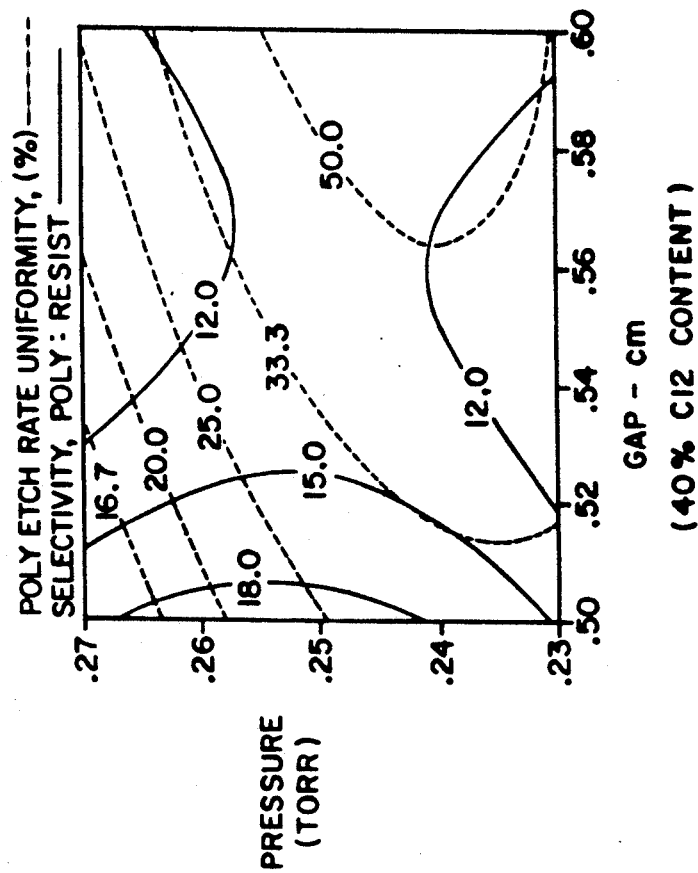

FIGS. 13A and 13B are contour plots of poly etch rate uniformity (dotted lines) and selectivity poly:resist. In FIG. 13, the uniformity contour lines have been labeled in "%" converted from the inverse of the uniformity values.

Figure 14B:
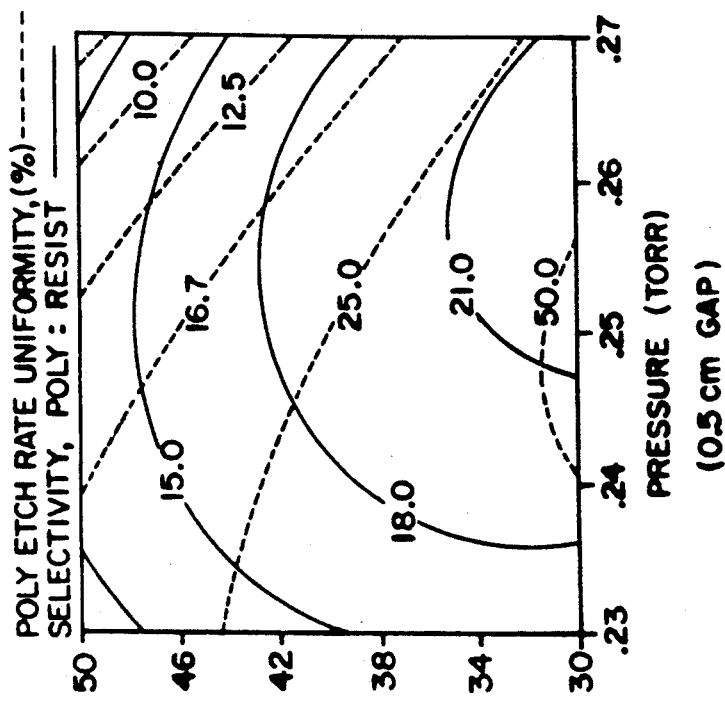
FIGS. 14A and 14B are contour plots of poly and oxide etch rates, poly uniformity and selectivity poly:resist in the second test matrix.
Figure 14A:
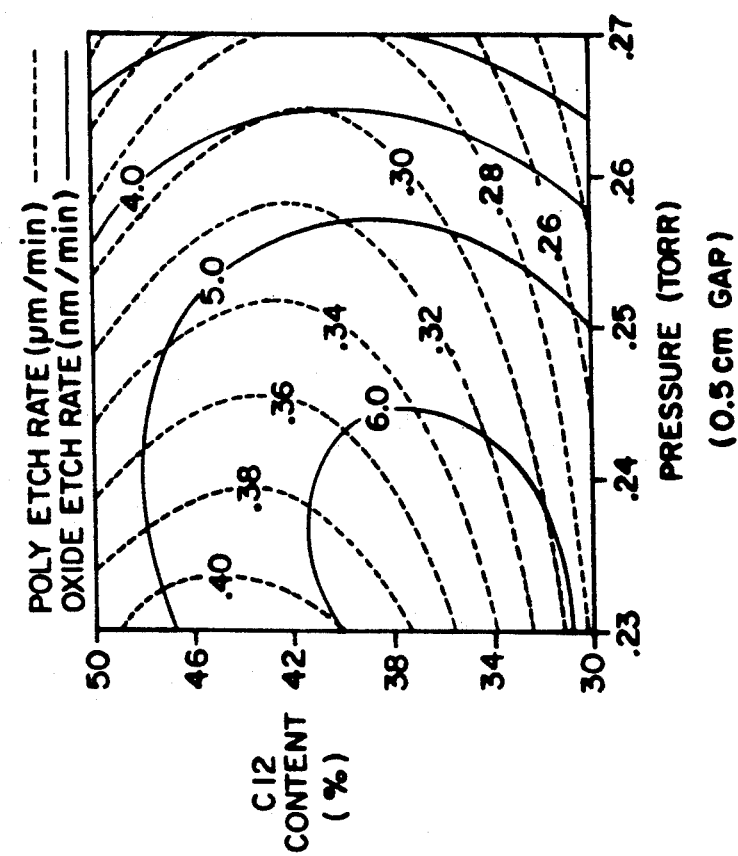

FIGS. 14A and 14B are contour plots of poly (FIG. 14A, solid lines) and oxide (FIG. 14 A dotted lines) etch rates, poly uniformity (FIG. 14B dotted lines), and selectivity poly:resist (FIG. 14B, solid lines). The poly:oxide selectivity is not illustrated because it did not fit well to a second order polynomial. The oxide etch rate was targeted at 40 Å/min, instead of targeting the selectivity itself.

Since the poly etch rate varies from 2500 Å/min to 4000 Å/min within the experimental range, an oxide etch rate of 40 Å/min would produce a selectivity poly:oxide in the range from 62:1 to 100:1.

Several wafers were etched with the HBr process for SEM (Scanning Electron Microscope) profile inspection. The poly sidewall profiles are not undercut or re-entrant with up to 60% overetch, but tend to become negative with 100% overetch. With 30% overetch, profiles appear vertical or slightly outwardly sloped, which is not undesirable. This constitutes a significant improvement over the baseline chlorine process (See Table 1) which occasionally produces re-entrant profiles with 30% overetch.

Figure 15A:
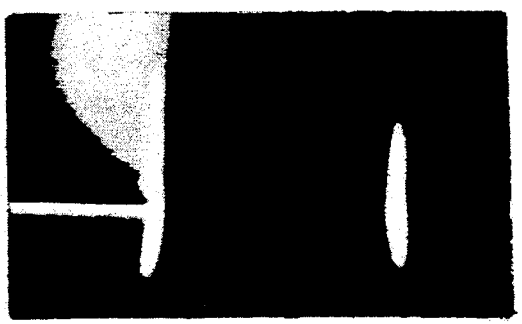
FIGS. 15A and 15B are photomicrographs of poly profiles with 30% and 100% overetch, according to the present invention.
Figure 15B:

FIGS. 15A and 15B are SEM images of poly profiles with 30% overetch (FIG. 15A) and 100% overetch (FIG. 15B).

The optimum $Cl_2$ is not clearly determined from the second matrix results. When varied alone, it not only changes the chlorine content, but also the He and percent contents and the total flow. Within the range of 20–40% HBr:$Cl_2$/HBr the main effect of HBr content is on the oxide etch rate. Therefore, reducing the $Cl_2$ flow from 100 down to 80 sccm will boost the HBr content from 27.5 up to 30%, and hence increase the selectivity poly:oxide. At the same time, it brings the total flow from 200 down to 180 sccm, which appears to be better from the viewpoint of increasing poly etch rate and selectivities (See FIG. 16), while producing a residence time (average time a gaseous species spends in the plasma before being pumped away) comparable to that of the baseline process (see Table 1).

Poly sidewall profiles were also found to look better with 80 sccm $Cl_2$ instead of 100 sccm. The ratio of HBr to $Cl_2$/HBr total flow increases from 35.5% to 40.7%, and improves confidence in the process reliability.

Figure 16A:
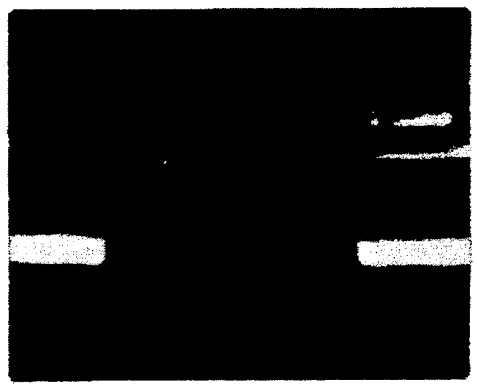
FIGS. 16A and 16B are photomicrographs of poly profiles with 80 and 100 sccm Cl$_2$ flow, according to the present invention.
Figure 16B:
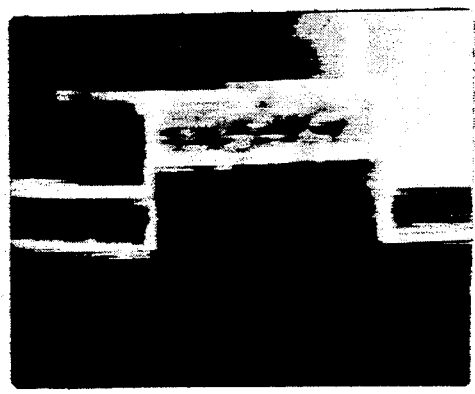

FIGS. 16A and 16B are SEM images of poly profiles with 80 sccm $Cl_2$ (FIG. 16A) and 100 sccm $Cl_2$ (FIG. 16B), with 270 mTorr, 200 Watts, 0.5 cm gap, 45 sccm He, and 55 sccm HBr.

Figure 17A:
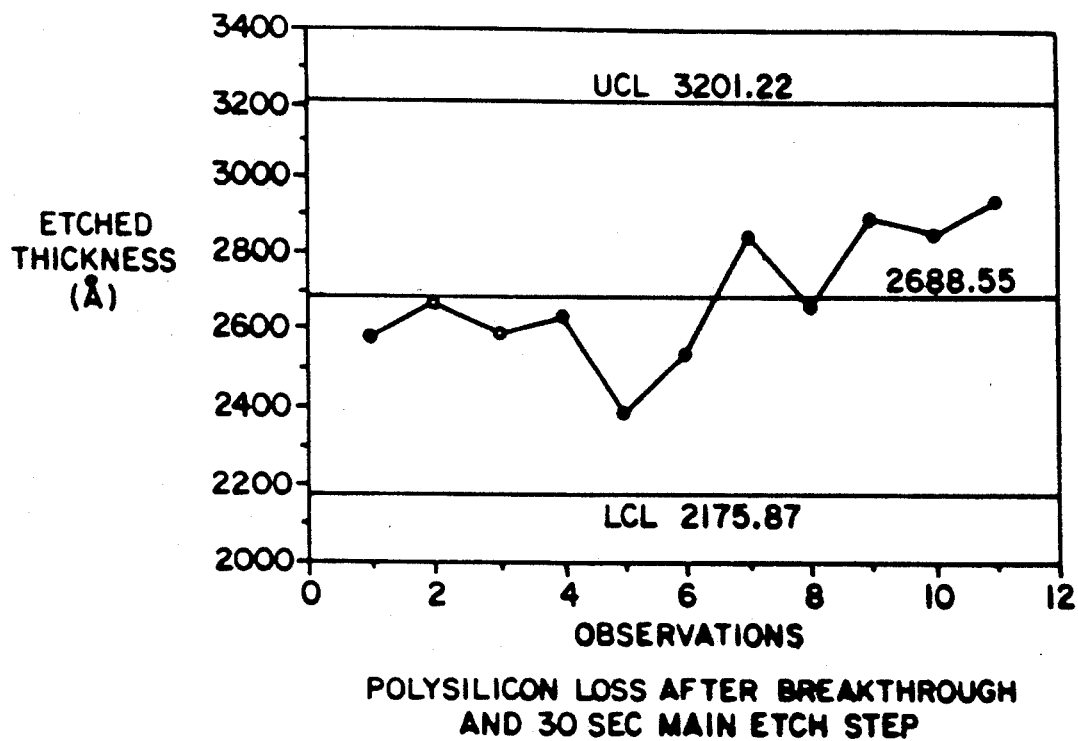
FIGS. 17A, 17B and 17C are plots of process data showing capability and reproducibility of the process of the present invention.
Figure 17B:
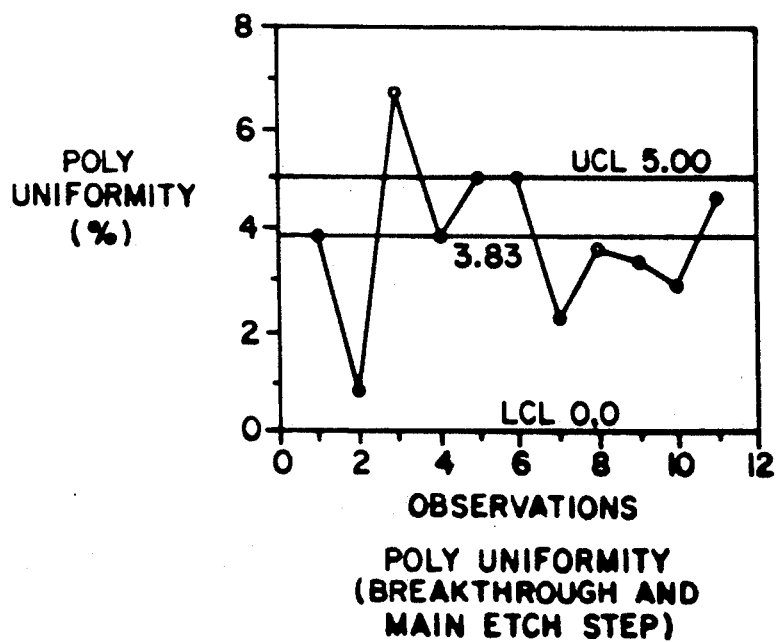
Figure 17C:
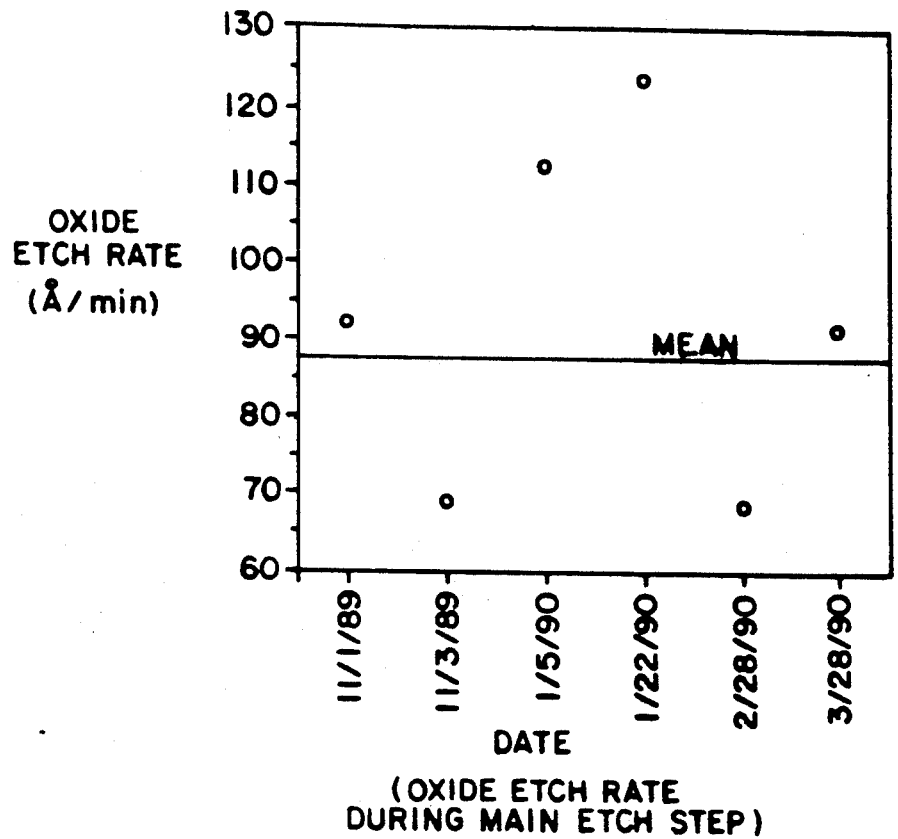

FIGS. 17A, 17B and 17C show process data collected over a period of time with the following process parameters: 200 Watts, 270 mTorr, 0.5 cm gap, 45 sccm He, 55 sccm HBr, 80 or 100 sccm $Cl_2$, with no HBr during a 5 second breakthrough step. These data provide experimental verification of process capability and reproducibility, within Upper Control Limits (UCL) and Lower Control Limits (LCL).

Figure 18A:
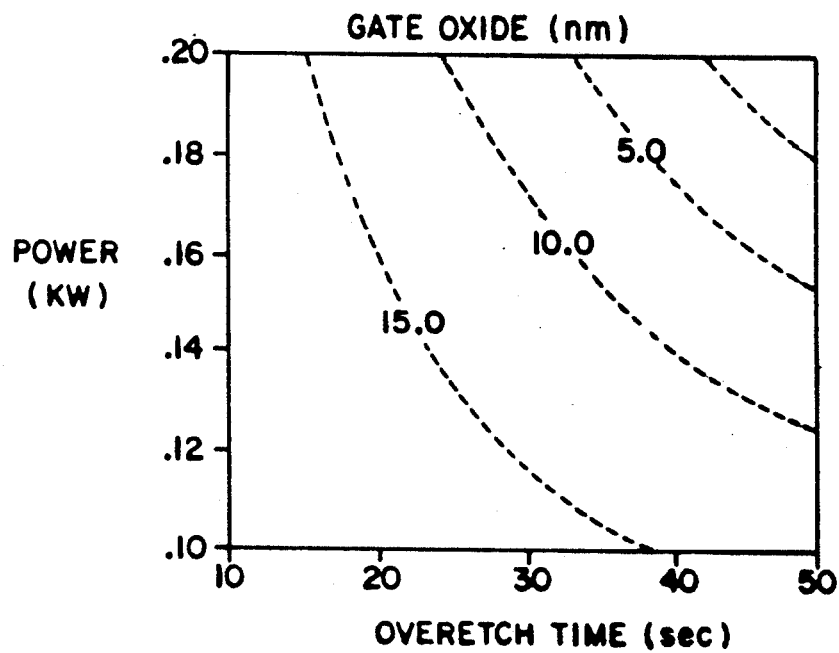
FIG. 18A, 18B and 18C are plots of remaining gate oxide as a function of overetch time and overetch power, according to the present invention.
Figure 18C:
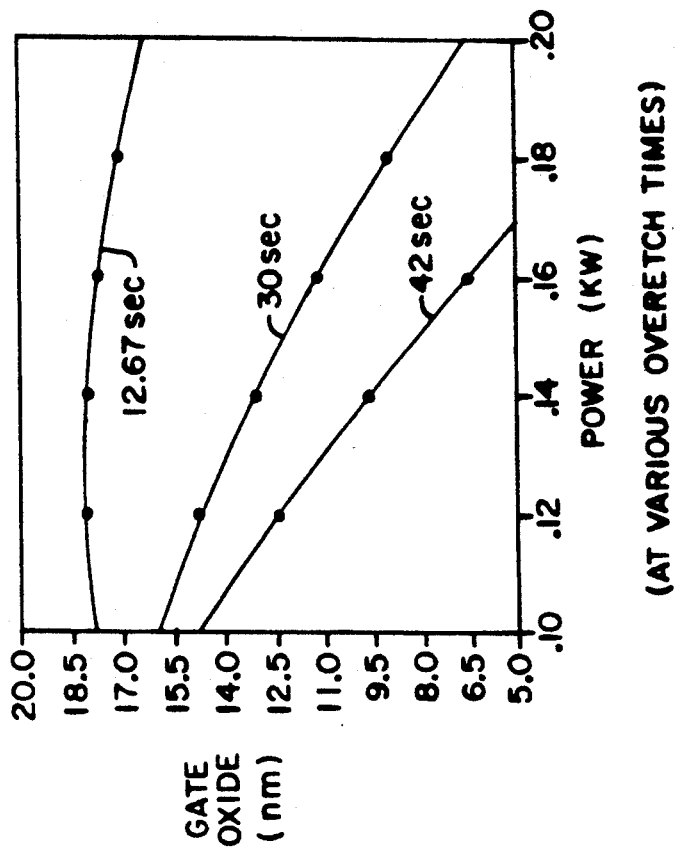
Figure 18B:
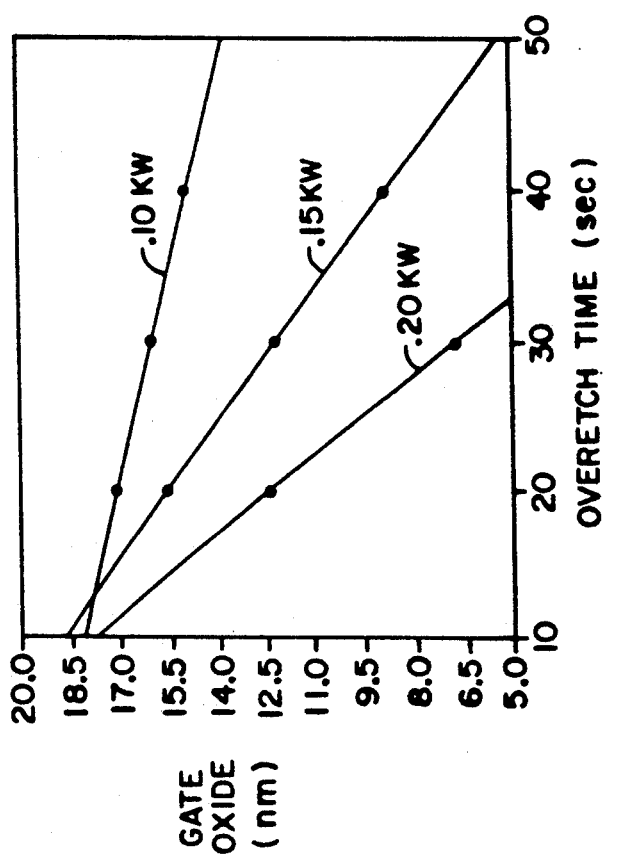

FIGS. 18A, 18B and 18C are plots of actual remaining gate oxide thickness after etching, against overetch power and overetch time. The initial gate oxide thickness is 200 Å. One way of reducing the oxide loss is to reduce the power during overetch, in which case the percent time overetch must be raised so as to achieve the same thickness overetch percentage, both of which might result in lateral etching. These Figures show how additional loss from increased overetch time is balanced, and possibly offset, by increased poly:oxide selectivity.

At 150 Watts, the poly etch rate is 22% slower than at 200 Watts. Typical overetch times with 200 Watts main etch power are about 13 seconds (30% of 43 seconds; time to endpoint). Therefore, at 200 Watts, the overetch power (with main etch power still at 200 Watts), the overetch time should be about 16 seconds, or 37% instead of 30%. From FIG. 18, it can be seen that this results in a gain of remaining gate oxide thickness.

Figure 19:
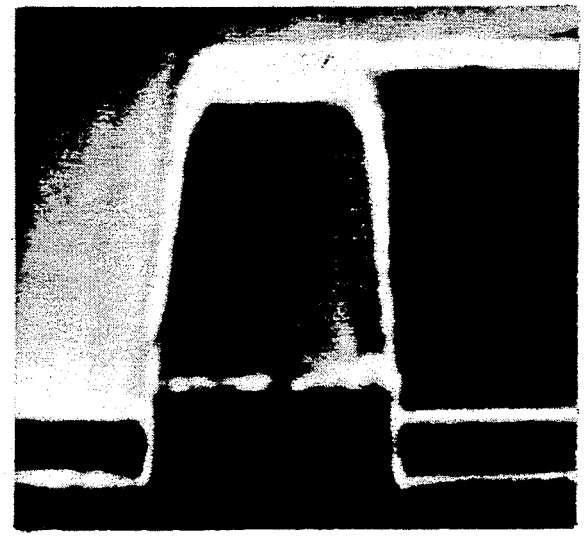
FIG. 19 is a photomicrograph of poly sidewall profile with resist mask, 60% overetch time, according to the present invention.

With 150 Watts overetch power and 60% overetch time, the poly sidewall profile is still acceptable (FIG. 19). Hence, it seems that lowering power during overetch is advantageous.

FIG. 19 is a SEM image of the poly sidewall profile with resist mask, with 60% overetch time at the following process parameters: 200 Watts during main etch, 150 Watts during overetch, 270 mTorr, 0.5 cm gap, 100 sccm $Cl_2$, 45 sccm He, and 55 sccm HBr.

Experimental Verification

In the experimental results that follow, the following process parameters were employed: 200 Watts, 270 mTorr, 0.50 cm gap, 100 sccm $Cl_2$ (50%), 55 sccm HBr (27.5%), and 45 sccm He (22.5%). Further, HBr was suppressed from a 5 second initiation step for breaking through native oxide found on the surface of the polysilicon. Although a breakthrough step is usually not necessary with the "baseline" chlorine process, failure to achieve breakthrough when using HBr results in nonuniform and possibly incomplete etching, because of the inherently low oxide etch rate. Further, elimination of native oxide was performed shortly before etching matrix wafers, because "sit" times of more than twelve hours may allow too much native oxide to regrow, which negatively affects the results. Therefore, since wafers must exit vacuum for before-etch poly thickness measurements, these measurements must be done as quickly as possible. Ideally, the whole experiment is carried out in a short time frame, such as half a day, so that the results are not affected too much by machine-related sources of variations.

Etch rate uniformity suffers from when wafers exit vacuum. Hence, more meaningful values are obtained from the combined uniformity of the breakthrough step and the main etch step.

Typically, an etching process comprises three etching steps: 1) breakthrough, 2) main etch, and 3) overetch, performed in sequence and the wafer does not exit vacuum.

According to the invention, the first step (breakthrough) contains no HBr for breaking through the native oxide, and lasts only about 5 seconds. Then the power is turned off and the HBr flow is initiated and allowed to stabilize to its selected value. Finally, power is turned on again for the main etch step with HBr for a fixed period of time.

In order to determine etch rate (ER) during main etch alone, the wafer should be measured immediately before and after the main etch step, but that requires that the wafer exit vacuum after breakthrough which is known to affect the measured etch rate negatively. In other words, etch rate (ER) and uniformity (UN) cannot be measured at the same time with complete accuracy.

Data for the two matrix experiments were obtained by taking the wafer out of vacuum for thickness measurements after a short breakthrough step had been applied to it. However, for experimental verification the concern is more with overall performance. Since achieving good etch rate uniformity is more important than achieving particular etch rate values, the combined uniformity of the breakthrough and the main etch step were examined (without exiting vacuum after breakthrough), rather than examining the uniformity of the main etch step alone. Hence, the etch rate of the main etch step could not be determined. Only the amount of polysilicon consumed could be measured (FIG. 17A).

The following information is also relevant: The etcher has a discharge gap "g" and a plasma pressure "p"; the product of the gap ("g", in cm) times the pressure ("p", in mTorr) divided by the total gas flow ("F", in sccm) related to the residence time is between 0.5 and 1.2; and the ratio of the square root of the power deposited in the plasma ("W", in watts) by the pressure "p", or $W^{1/2}/p$, related to the ratio of the electrical field ("E") to the pressure (E/p) is within 0.046 to 0.070.

Preferably, the bromine:chlorine mole ratio is maintained above 24%, and preferably at approximately 34%.

Conclusion

An anisotropic polysilicon etching process in $Cl_2$/HBr/He is disclosed. The use of HBr allows operation under high poly:oxide selectivity conditions that would otherwise produce lateral etching of poly under the photoresist mask (isotropy). Selectivity poly:resist is also greatly increased with HBr. Therefore, the use of HBr appears to enhance poly sidewall passivation without relying on resist redeposition.

The disclosed process has a wider window and is less sensitive than a baseline chlorine process, especially with respect to profile control.

Preferred process settings are: 270 mTorr, 200 Watts, 0.5 cm gap, 45 sccm He, 80 sccm $Cl_2$, 55 sccm HBr.

Overall, the selectivity poly:oxide has been improved from 30:1 to above 40:1, the selectivity poly:resist has been improved from 1.6:1 to above 4:1, and anisotropy is realized with up to 60% overetch as compared with 30% in a chlorine only process (which can occasionally produce notching). Gate oxide loss can be contained within 50 Å with 30% overetch, while etching 3400 Å $POCl_3$ poly. This figure could be improved at no expense to the profile control by dropping the power during overetch (to 100-150 Watts).

Using etching equipment other than that described above, it is evident that the equipment-specific process parameters would be scaled accordingly.

What is claimed is:

1. Anisotropic polysilicon etching process comprising:
    exposing a wafer having a polysilicon film (poly) overlying an oxide layer, and having a resist mask overlying the poly film, to a plasma in an etcher, wherein the plasma has a total flow of He, HBr and Cl-containing gases, as follows:
    the percent of He flow in the total flow is within 0-30% of the total flow;
    the balance of the total flow is HBr and any chlorine-containing gas such as $Cl_2$, $BCl_3$, or HCl; and
    the percent of HBr flow in the balance of the total flow is within 30-50%;
    wherein:
    the etcher has a discharge gap "g" and a plasma pressure "p";
    the plasma flow has a residence time, and an electrical field having a discharge power is deposited in the plasma;
    the product of the gap ("g", in cm) times the pressure ("p", in mTorr) divided by the total gas flow ("F", in sccm) related to the residence time is between 0.5 and 1.2; and
    the ratio of the square root of the power deposited in the plasma ("W", in watts) by the pressure "p", or $W^{1/2}/p$, related to the ratio of the electrical field ("E") to the pressure (E/p) is within 0.046 to 0.070.

2. Process according to claim 1, wherein:
    the chlorine-containing gas is $Cl_2$.

3. Process according to claim 1, wherein
    the plasma is sustained at a gas pressure, has a discharge power, and has a discharge gap;
    the gases have a total flow rate and individual flow rates;
    the pressure of the plasma is approximately 270 mTorr;
    the discharge power is approximately 200 Watts;
    the discharge gap is approximately 0.5 cm;
    the total flow rate is approximately 180-200 sccm;
    the $Cl_2$ flow rate is approximately 80-100 sccm;
    the HBr flow rate is approximately 55 sccm; and
    the He flow rate is approximately 45 sccm.

4. Process according to claim 3, wherein:
    the total flow rate is approximately 180 sccm;
    the $Cl_2$ flow rate is approximately 80 sccm.

5. Process according to claim 3, wherein:
    the total flow rate is approximately 200 sccm;
    the $Cl_2$ flow rate is approximately 100 sccm.

6. Process according to claim 1, wherein:

the parameters set forth in claim 17 are maintained during a main etch step;
the plasma is sustained at an applied discharge power during the main etch step;
a subsequent overetch step is performed;
during the subsequent overetch step, the applied power is reduced by up to 50% with respect to its settled level during the main etch step.

7. Process according to claim 1, wherein
the plasma is sustained at a gas pressure, has a discharge power, and has a discharge gap;
the gases have a total flow rate and individual flow rates;
the pressure of the plasma is approximately 230–270 mTorr;
the discharge power is approximately 190 Watts;
the discharge gap is approximately 0.5–0.6 cm;
the total flow rate is approximately 200 sccm;
the $Cl_2$ flow rate is approximately 100 sccm;
the HBr flow rate is approximately 55 sccm; and
the He flow rate is approximately 45 sccm.

8. Process according to claim 1, wherein:
the plasma is sustained at a gas pressure, has a discharge power, and has a discharge gap;
the gases have a total flow rate and individual flow rates;
the pressure of the plasma is approximately 250 mTorr;
the discharge power is approximately 150–190 Watts;
the discharge gap is approximately 0.5 cm;
the total flow rate is approximately 150–200 sccm;
the $Cl_2$ flow rate is approximately 50% of the total flow rate;
the HBR flow rate is approximately 20–40% of the total flow rate; and
the He flow rate is approximately 10–30% of the total flow rate.

9. Process according to claim 1, wherein
the plasma is sustained at a gas pressure, has a discharge power, and has a discharge gap;
the gases have a total flow rate and individual flow rates;
the pressure of the plasma is approximately 250 mTorr;
the discharge power is approximately 190 Watts;
the discharge gap is approximately 0.5 cm;
the total flow rate is approximately 190 sccm;
the $Cl_2$ flow rate is approximately 100 sccm;
the HBr flow rate is approximately 50 sccm; and
the He flow rate is approximately 40 sccm.

10. Process according to claim 1, wherein:
the gases have a total flow rate and individual flow rates;
the $Cl_2$ flow rate is approximately 53% of the total flow rate;
the HBr flow rate is approximately 26% of the total flow rate; and
the He flow rate is approximately 21% of the total flow rate.

11. Process according to claim 1, yielding:
a poly:oxide selectivity in excess of 30:1.

12. Process according to claim 1, yielding:
a poly:resist selectivity in excess of 4:1.

13. Process according to claim 1, wherein:
the etcher has two parallel plate electrodes;
one of the electrodes is powered, while the other electrode is grounded; and
the temperature of the electrodes is maintained between 0°–90° C.

14. Process according to claim 13, wherein:
the electrode temperature is maintained at approximately 20° C.

15. Process according to claim 1, wherein:
a leakback of $O_2$, having a measurable rate, is associated with the process; and
the leakback rate is maintained at a minimum, corresponding to less than 0.4 percent $O_2$ by volume.

16. Process according to claim 1, wherein:
a leakback of $O_2$, having a measurable rate, is associated with the process; and
the leakback rate is maintained at less than approximately 5 mTorr/min.

17. Process according to claim 1, wherein:
an initial (breakthrough) etch step is performed that has low selectivity poly:oxide to break through native oxide formed on the surface of the wafer; and
the breakthrough step contains no bromine addition and removes less than 30% of the initial poly film thickness.

18. Process according to claim 1, wherein:
a mole ratio of bromine:chlorine is maintained above 24%.

19. Process according to claim 18, wherein:
a mole ratio of bromine:chlorine is maintained at approximately 34%.

* * * * *